US008587947B2

(12) United States Patent
Yonemochi

(10) Patent No.: US 8,587,947 B2
(45) Date of Patent: Nov. 19, 2013

(54) HEAT SPREADER FOR IC PACKAGE, AND IC PACKAGE CLAMPER HAVING THE HEAT SPREADER

(75) Inventor: Masahiro Yonemochi, Nagano (JP)

(73) Assignee: Shinko Electric Industries Co., Ltd., Nagano-Shi (JP)

(*) Notice: Subject to any disclaimer, the term of this patent is extended or adjusted under 35 U.S.C. 154(b) by 247 days.

(21) Appl. No.: 13/287,510

(22) Filed: Nov. 2, 2011

(65) Prior Publication Data

US 2012/0113599 A1 May 10, 2012

(30) Foreign Application Priority Data

Nov. 4, 2010 (JP) ................................. 2010-247685

(51) Int. Cl.
*H05K 7/20* (2006.01)
(52) U.S. Cl.
USPC ........... 361/719; 361/710; 361/711; 361/715; 361/760; 174/252; 174/548; 439/70; 439/331; 439/485
(58) Field of Classification Search
USPC ............... 361/679.46–679.58, 688, 701–722, 361/751–761
See application file for complete search history.

(56) References Cited

U.S. PATENT DOCUMENTS

| 6,219,241 | B1* | 4/2001 | Jones ............................. 361/704 |
| 6,877,990 | B2* | 4/2005 | Liao et al. ........................ 439/41 |
| 6,932,622 | B2* | 8/2005 | Liao et al. ........................ 439/73 |
| 6,957,973 | B1* | 10/2005 | McHugh et al. .............. 439/331 |
| 7,247,043 | B2* | 7/2007 | Lai ................................. 439/331 |
| 2004/0067672 | A1* | 4/2004 | Ma ................................. 439/331 |
| 2004/0095693 | A1* | 5/2004 | Shirai et al. ...................... 361/1 |
| 2005/0064753 | A1* | 3/2005 | Ma ................................. 439/331 |
| 2008/0151511 | A1* | 6/2008 | Martinson et al. ............. 361/748 |
| 2011/0273858 | A1* | 11/2011 | Heng et al. .................... 361/803 |

FOREIGN PATENT DOCUMENTS

| JP | 2563182 B | 9/1996 |
| JP | 10-056278 | 2/1998 |

* cited by examiner

*Primary Examiner* — Courtney Smith
(74) *Attorney, Agent, or Firm* — Rankin, Hill & Clark LLP

(57) ABSTRACT

According to one aspect of the present invention, there is provided a heat spreader to be mounted on an IC package, the IC package including: a circuit board; an IC chip mounted on one surface of the circuit board; and a plurality of connection terminals formed on the other surface of the circuit board, the heat spreader including: a top wall formed into a rectangular shape; a circumferential wall formed continuously from the top wall, the circumferential wall and the top wall defining a block-like cavity for enclosing the IC chip when the heat spreader is mounted on the IC package; and ear portions formed at lengthwise central portions of a facing pair of side walls of the circumferential wall so to extend outwardly from bottom edges of the facing pair of side walls, respectively.

8 Claims, 10 Drawing Sheets

Fig. 5B (Y-Y CROSS-SECTION)

Fig. 5C (X-X CROSS-SECTION)

Fig. 9B (Y-Y CROSS-SECTION)

Fig. 9C (X-X CROSS-SECTION)

HEAT SPREADER FOR IC PACKAGE, AND IC PACKAGE CLAMPER HAVING THE HEAT SPREADER

CROSS-REFERENCE TO RELATED APPLICATION(S)

This application claims priorities from Japanese Patent Application No. 2010-247685 filed on Nov. 4, 2010, the entire contents of which are incorporated herein by reference.

FIELD

Embodiments described herein relate generally to a heat spreader for spreading heat generated from an integrated circuit (IC) chip mounted on an IC package, and an IC package clamper having the heat spreader.

BACKGROUND

There are proposed various heat spreaders for spreading heat generated from an IC chip mounted on an IC package.

For example, JP-2563182-B describes a heat sink attaching apparatus in which a gate array is mounted inside a space (cavity) defined by a frame, and a finned heat sink is provided to make contact with a top surface pad of the gate array, thereby spreading heat generated from the gate array.

While the heat spreading efficiency of the above-mentioned heat sink is good as it is provided with plural fins laminated along a post, such structure is complicated, and the operation (catching the post with a hole formed in a heat sink clip by inserting the heat sink clip between two of the fins) required for attaching the heat sink is cumbersome.

Thus, there is a demand for a heat spreader which has a simple structure, and can be easily attached. For example, a so-called hat type heat spreader as shown in FIGS. 10A and 10B is proposed.

As illustrated in FIGS. 10A and 10B, a heat spreader 100 has a top wall 101, a circumferential wall 102 formed continuously from the entire circumference of the top wall 101, and a flange 103 extended outwardly from the bottom edge of the circumferential wall 102.

For example, it is assumed that an IC chip is mounted on a circuit board as an IC package, and the circuit board is mounted on a motherboard together with a socket. The above-mentioned heat spreader 100 is mounted on the circuit board to surround the IC chip, and then, the heat spreader 100 is attached to the socket together with the circuit board. At that time, the flange 103 of the heat spreader 100 is pressed by a turnable lid member of the socket. Consequently, plural connection terminals formed on the bottom surface of the circuit board are electrically connected to plural connection bumps formed on a base substrate of the socket, respectively.

Here, while the flange 130 is formed on the entire circumference of the circumferential wall of the heat spreader 100, only a part of the whole area of the flange 130 is to be pressed by the lid member of the socket, and the remained non-pressed part is a waste.

On the other hand, in an IC package, the number of chips mounted on a circuit board has been recently increased due to the advance of the implementation of a multichip structure, and the size of the circuit board is correspondingly increased. Sometimes, the multichip structure is restrained, depending upon the shape of a heat spreader. Thus, it is requested to increase the cavity volume of the heat spreader so that it can cover each IC chip in the IC package, in order to assure the flexibility of the implementation of the multichip structure.

SUMMARY

According to an aspect of the present invention, there is provided a heat spreader to be mounted on an IC package, the IC package including: a circuit board; an IC chip mounted on one surface of the circuit board; and a plurality of connection terminals formed on the other surface of the circuit board, the heat spreader including: a top wall formed into a rectangular shape; a circumferential wall formed continuously from the top wall, the circumferential wall and the top wall defining a block-like cavity for enclosing the IC chip when the heat spreader is mounted on the IC package; and ear portions formed at lengthwise central portions of a facing pair of side walls of the circumferential wall so to extend outwardly from bottom edges of the facing pair of side walls, respectively.

According to another aspect of the present invention, there is provided an IC package clamper including: an IC package including: a circuit board; an IC chip mounted on one surface of the circuit board; and a plurality of connection terminals formed on the other surface of the circuit board; a heat spreader mounted on the IC package including: a top wall formed into a rectangular shape, a bottom surface of the top wall contacting a top surface of the IC chip; a circumferential wall formed continuously from the top wall, a bottom edge of the circumferential wall contacting a top surface of the circuit board, the circumferential wall and the top wall defining a block-like cavity in which the IC chip is enclosed; and ear portions formed at lengthwise central portions of a facing pair of side walls of the circumferential wall so to extend outwardly from the bottom edges of the facing pair of side walls, respectively; and a socket clamping the IC package together with the heat spreader, the socket including: a socket body configured to receive the circuit board; a plurality of connection bumps formed in the socked body, the connection bumps being electrically connected to the connection terminals, respectively; a lid member turnably attached to one side of the socket body so as to be openable/closable with respect to the socket body, the lid member and the socket body clamping the IC package and the heat spreader therebetween; and a pair of pressing portions formed on the lid member and configured to elastically press the ear portions, respectively, in a state where the IC package and the heat spreader are clamped between the lid member and the socket body.

According to the above-mentioned structures, ear portions are respectively formed at lengthwise central portions of facing side walls of the circumferential wall, to extend outwardly from bottom edges of the side walls, respectively, without forming a flange over the entire circumference of the circumferential wall of the heat spreader. The ear portions are elastically pressed by a pair of the pressing portions of the socket. Thus, the other pair of side walls of the circumferential wall having no ear portions can be shifted outwardly by the ear portion's width as compared with a case where an ear portion or flange would be formed thereon. According to the above-mentioned aspects of the present invention, there is provided a heat spreader suitable for the implementation of the multichip structure of an IC package by increasing a cavity area/volume without changing the overall size thereof, and an IC package clamper having such a heat spreader.

BRIEF DESCRIPTION OF DRAWINGS

FIG. 5B is a cross-sectional view taken on line Y-Y in FIG. 5A, and FIG. 5C is a cross-sectional view taken on line X-X in FIG. 5A.

FIG. 9B is a cross-sectional view taken on line Y-Y in FIG. 9A, and FIG. 9C is a cross-sectional view taken on line X-X in FIG. 9A.

DETAILED DESCRIPTION

A heat spreader according to a first embodiment will be described with reference to FIG. 1.

Figure 1A:
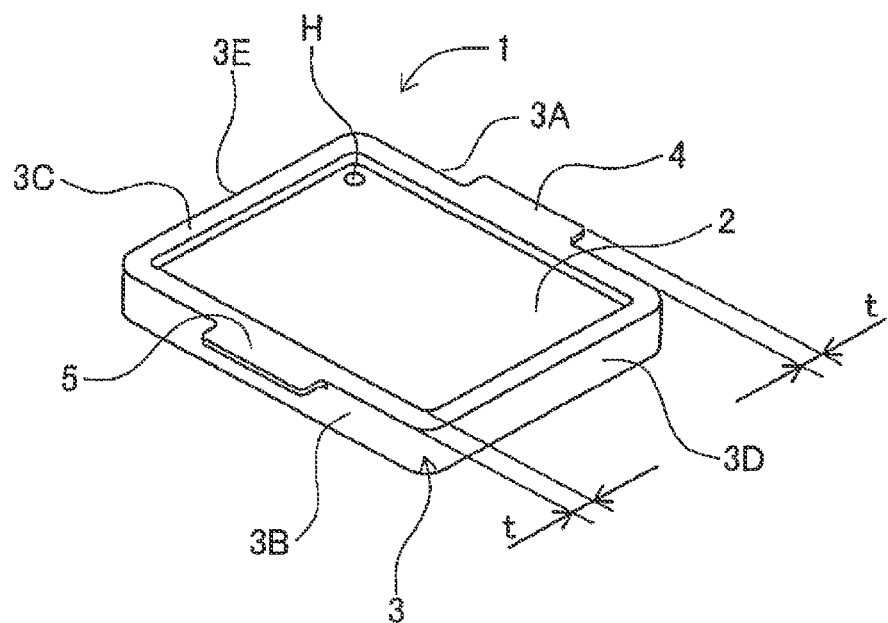
FIG. 1A illustrates the back surface of a heat spreader according to a first embodiment.
Figure 1B:
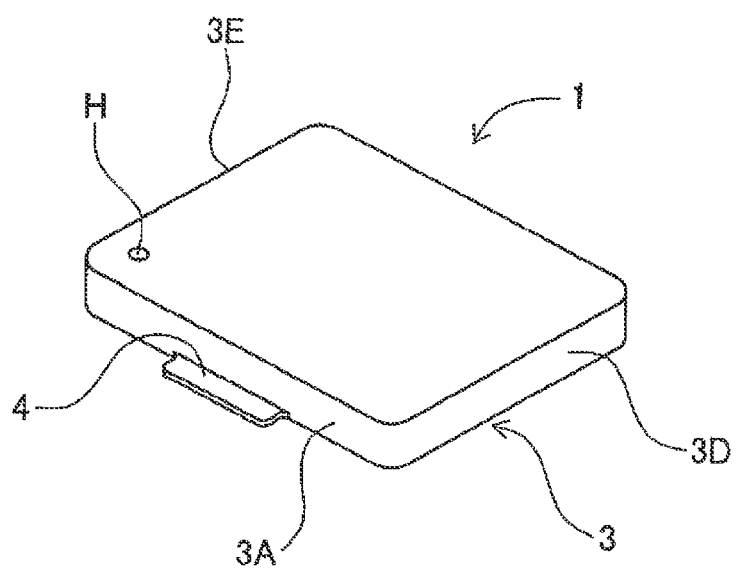
FIG. 1B illustrates the top surface of the heat spreader.

As illustrated in FIG. 1, a heat spreader 1 is formed into a rectangular-box-like shape by performing press working or the like onto a metal plate obtained by plating a copper surface with nickel. The heat spreader 1 has a substantially rectangular-shaped top wall 2, a circumferential wall 3, and rectangular ear portions 4 and 5. The circumferential wall 3 is formed continuously from the entire circumference of the top wall 2. The circumferential wall 3 includes a pair of side walls 3A and 3B which face each other. The ear portions 4 and 5 are respectively formed at lengthwise central portions of the side walls 3A and 3B, to extend horizontally and outwardly from the bottom edges of the side walls 3A and 3B.

Widths of the ear portions 4 and 5 extending outwardly from the wall surfaces of the side walls 3A and 3B are set at t (e.g., 1.5 millimeters (mm)). And, the width (or thickness) of the circumferential wall 3 is set at t (e.g., 1.5 mm).

On a pair of side walls 3D and 3E of the circumferential wall 3, which respectively adjoin the side walls 3A and 3B and face each other, no ear portions are formed. Since no ear portions are formed on the side walls 3D and 3E, each of the side walls 3D and 3E can be shifted outwardly by the ear portion's width as compared with a case where an ear portion or flange would be formed thereon, without increasing the overall size of the heat spreader 1.

A degassing hole H for discharging organic solvent gas generated from adhesive layers 9 and 10 which is used to bond the heat spreader 1 to an IC package 6 (a circuit board 7 and a chip 8) is provided at a corner portion of the heat spreader 1, as will be described below.

Figure 2:
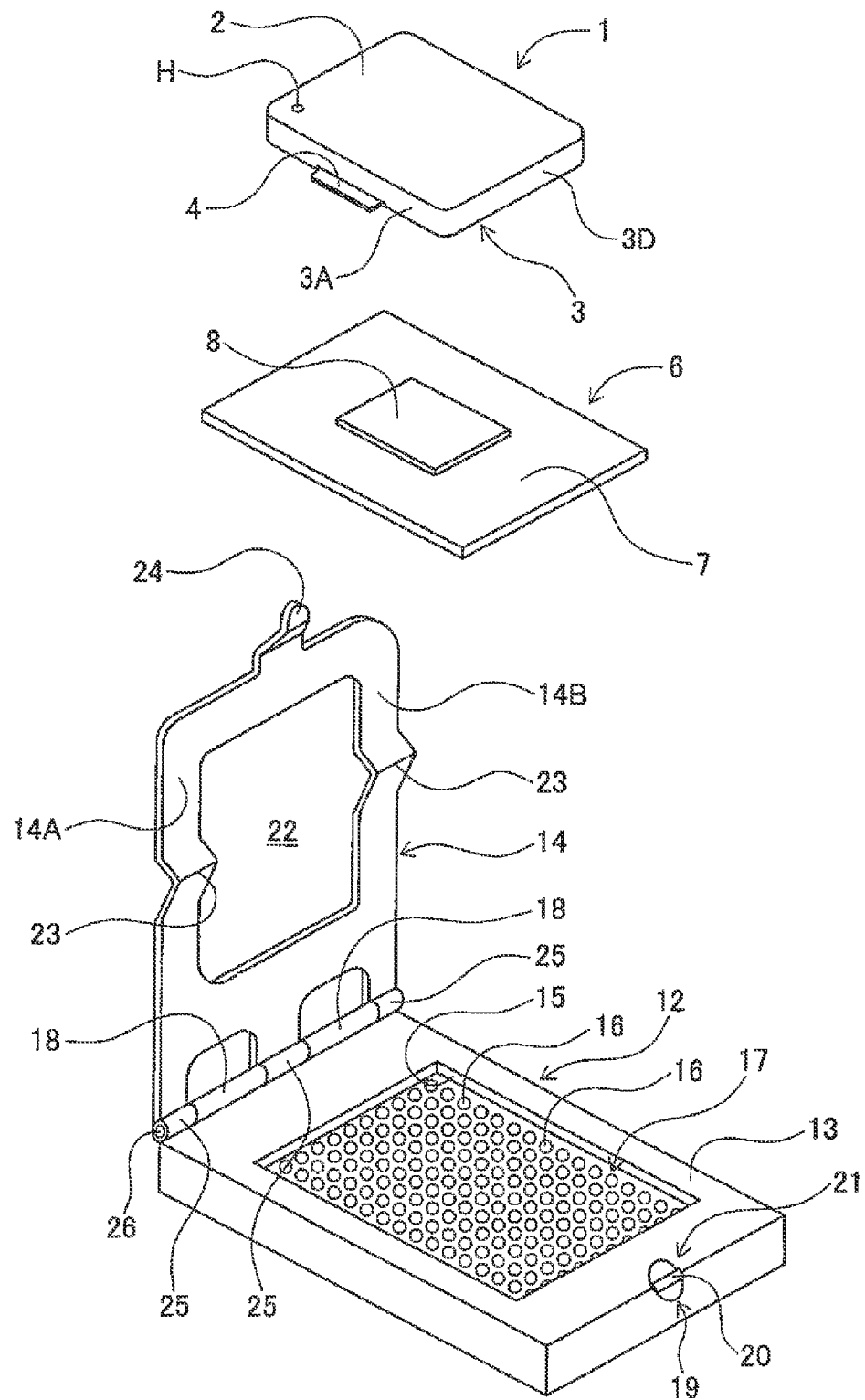
FIG. 2 is an exploded view illustrating an IC package clamper on which the heat spreader is mounted.

Next, a clamper for using the heat spreader 1 as a heat spreader for an IC chip of the IC package and for connecting such an IC package to a motherboard is described hereinafter with reference to FIGS. 2 to 4.

In this embodiment, the IC package 6 includes the circuit board 7 and the IC chip 8 mounted thereon. As illustrated in FIGS. 2 to 4, first, the heat spreader 1 is bonded to the circuit board 7 to surround the IC chip 8.

Figure 5A:
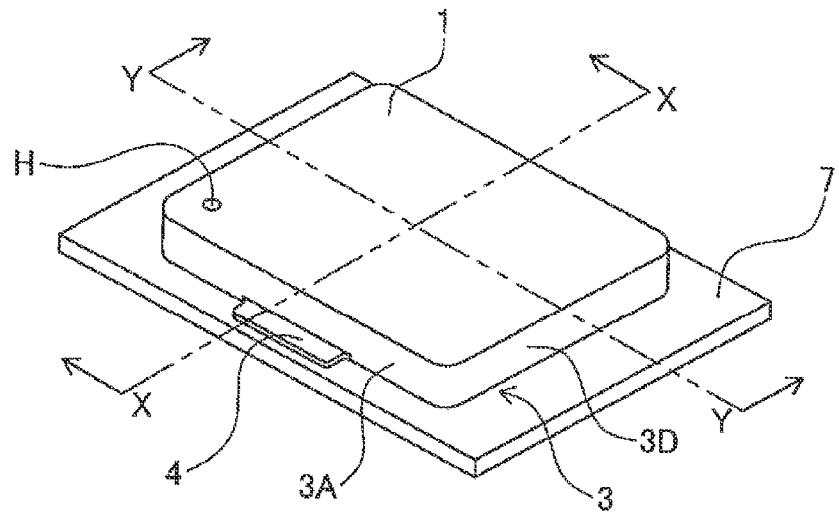
FIG. 5A illustrates an IC package on which the heat spreader is mounted.
Figure 5A:
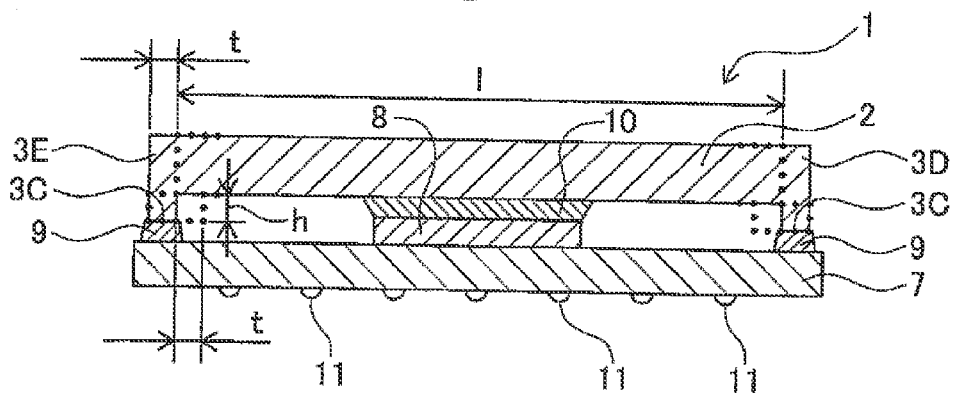
Figure 5A:
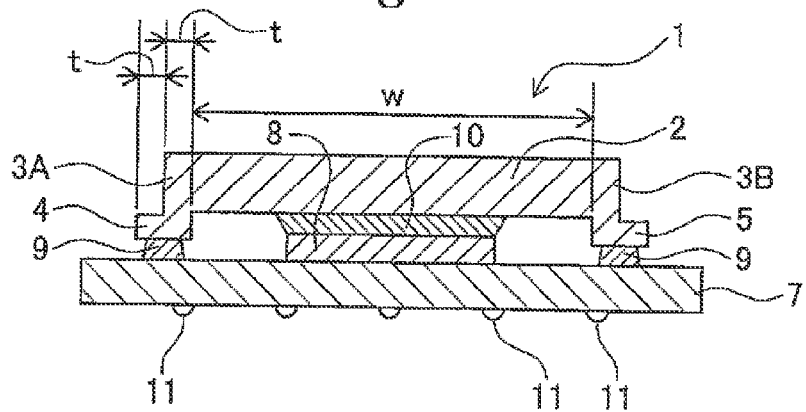

As illustrated in FIGS. 5A to 5C, the heat spreader 1 is fixed to the circuit board 7 such that a bottom edge 3C of the circumferential wall 3 is bonded to the top surface of the circuit board 7 via the adhesive layer 9. Similarly, the ear portions 4 and 5 on the side walls 3A and 3B of the circumferential wall 3 are bonded to the top surface of the circuit board 7 via the adhesive layer 9. In addition, the back surface of the top wall 2 is bonded to the top surface of the IC chip 8 via the adhesive layer 10. Thus, the heat spreader 1 is bonded and fixed to the IC package 6.

Plural connection terminals 11 are formed on the bottom surface of the circuit board 7. Plural connection bumps 16 are formed on a base substrate 17 provided in a socket 12 so as to be connected to the motherboard (not illustrated), and the connection terminals 11 are pressure-bonded and connected to the connection bumps 16, respectively.

The IC package 6 is connected and fixed to the motherboard (not illustrated) via the socket 12 serving as the clamper together with the heat spreader 1. The socket 12 has a socket body 13 and a lid member 14 turnably supported at one side (i.e., a left side, as viewed in FIG. 2) of the socket body 13.

In the top surface of the socket body 13, an opening 15 is formed to have substantially the same size as that of the circuit board 7. The base substrate 17 having the plural connection bumps 16 thereon is provided in the opening 15. Each of the connection bumps 16 is generated by forming an Au-plating layer on the top surface of a solder bump.

The base substrate 17 also has connection terminals at the bottom surface correspondingly with the connection bumps 16 formed on the top surface. Each of the connection bumps 16 is connected to an associated one of the connection terminals, and each of the connection terminals is connected to an associated one of connection terminals of the motherboard (not illustrated). Thus, the connection terminals 11 of the circuit board 7 are respectively connected to the motherboard (not illustrated). Since such a connection structure has been known, the description thereof is omitted.

Two axial support portions 18 are formed on one side (i.e., a left side, as viewed in FIG. 2) of the socket body 13. An engaging portion 21 configured by a semispherical concave groove 19 and a bar-like portion 20 is provided on the other side of the socket body 13.

A lid member 14 is formed of an elastic metal thin plate. An opening 22 is formed in a central portion of the lid member 14 to be slightly larger in size than the heat spreader 1. Such a lid member 14 is provided with a pair of pressing portions 14A and 14B that are formed on both sides (i.e., left and right sides, as viewed in FIG. 2) of the opening 22 to face each other. A pressing projection 23 having a V-shape in side view is formed at a lengthwise central portion of each of pressing portions 14A and 14B.

An engaging piece 24 to be engaged with the engaging portion 21 of the socket body 13 is formed at a central portion on one side (i.e., an upper side, as viewed in FIG. 2) of the lid member 14. Three axial support portions 25 are provided on the other side (i.e., a lower side, as viewed in FIG. 2) so as to respectively sandwich the axial support portions 18 of the socket body 13 therebetween. A support shaft 26 is inserted through the axial support portions 18 and 25, thereby turnably attaching the lid member 14 to the socket body 13 so that the top surface of the socket body 13 is opened/closed.

Before attaching the IC package 6 to the socket 12, as described above, the heat spreader 1 is bonded to the IC package 6 such that the bottom edge 3C of the circumferential wall 3 is bonded to the top surface of the circuit board 7 via the adhesive layer 9, while the ear portions 4 and 5 are bonded to the top surface of the circuit board 7 via the adhesive layer 9. At this time, the top surface of the IC chip 8 mounted on the circuit board 7 and the back surface of the top wall 2 are bonded to each other via the adhesive layer 10. Thus, the heat spreader 1 is bonded and fixed to the IC package 6.

Figure 3:
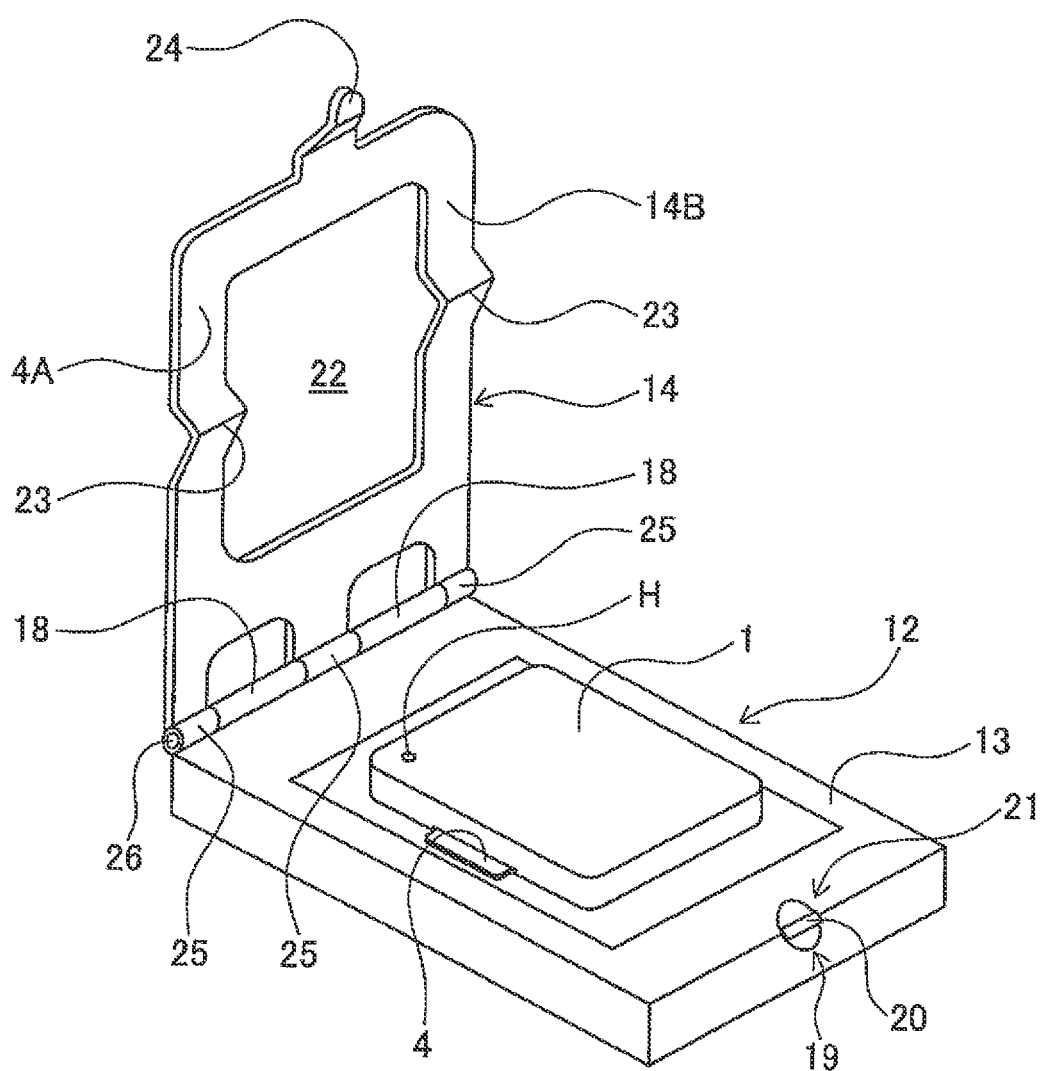
FIG. 3 illustrates a state where an IC package on which the heat spreader is mounted is mounted on a socket.

Then, as illustrated in FIG. 3, the IC package 6 to which the heat spreader 1 is bonded and fixed is fit into the opening 15 provided in the top surface of the socket body 13. In this state, the connection terminals 11 on the circuit board 7 are respectively aligned with the connection bumps 16 on the base substrate 17, the top surface of the circuit board 7 is flush with that of the socket body 13, and the ear portions 4 and 5 are upwardly positioned with respect to a common flush surface of the circuit board 7 and the socket body 13.

Figure 4:
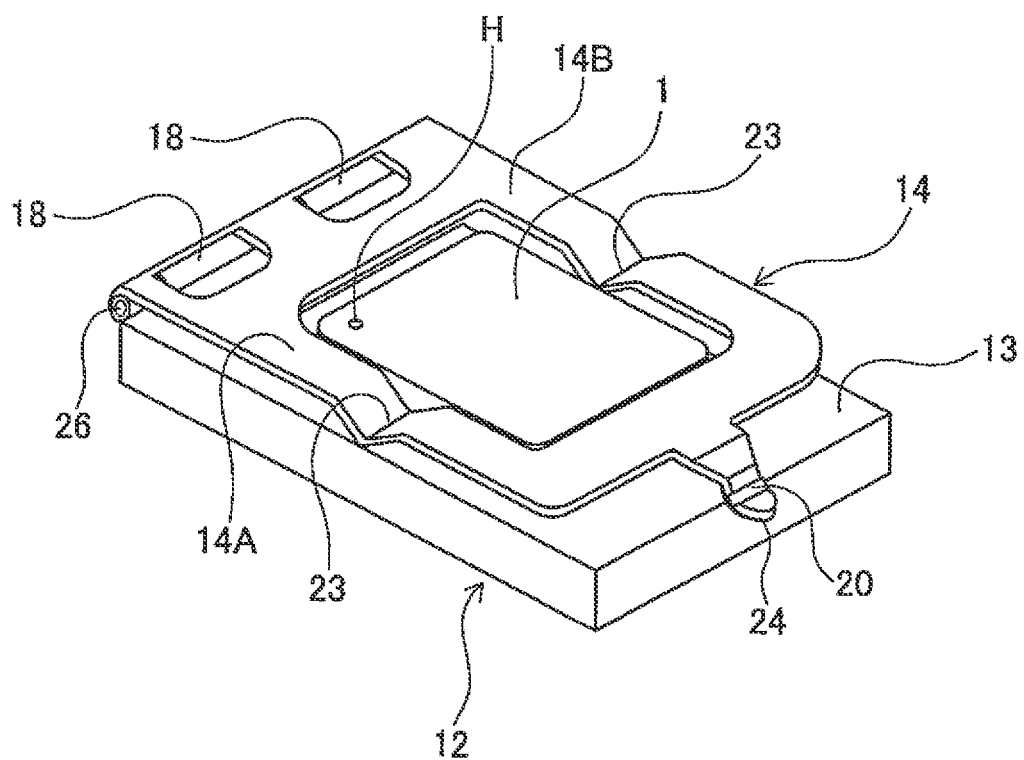
FIG. 4 illustrates a state wherein an IC package on which the heat spreader is mounted is mounted on a socket, and wherein a lid member is closed.

Then, the lid member 14 is turned in a direction (i.e., a direction to a near or right side, as viewed in FIG. 3) in which the socket body 13 is closed, and the engaging piece 24 is engaged with the bar-like portion 19 of the engaging portion 21, as illustrated in FIG. 4.

As illustrated in FIG. 4, in a state where the socket body 13 is closed by the lid member 14, the V-shaped pressing projections 23 and 23 on the pressing portions 14A and 14B elastically press the ear portions 4 and 5 of the heat spreader 1. Consequently, the connection terminals 11 on the circuit board 7 are respectively electrically connected to the connection bumps 16 on the top surface of the base substrate 17 which is provided on the socket body 13 of the socket 12.

According to the first embodiment, in the heat spreader 1, and the clamper for connecting the IC package 6 to the motherboard (not illustrated), which uses the heat spreader 1, the ear portions 4 and 5 are formed to each extend horizontally and outwardly from the bottom edge 3C of an associated one of the facing pair of side walls 3A and 3B at the lengthwise central portion thereof, without forming a flange along the entire circumference of the circumferential wall 3 of the heat spreader 1. Each of the ear portions 4 and 5 is elastically pressed by a pair of the pressing projections 23 and 23 formed on the lid member 14 of the socket 12. Thus, positions of the other facing pair of the side walls 3D and 3E of the circumferential wall 3 having no ear portions can be shifted outwardly by the width t of each ear portion as compared with a case where an ear portion or flange would be formed thereon. Accordingly, the first embodiment can realize the heat spreader 1 suitable for the implementation of the multichip structure of an IC package by increasing a cavity area/volume without changing the overall size thereof. In addition, the first embodiment can realize the clamper for connecting the IC package 6 to a motherboard, which has the heat spreader 1.

Hereinafter, why the cavity area/volume can be increased according to the heat spreader 1 according to the first embodiment will be described with reference to FIGS. 5A to 5C.

As illustrated in FIG. 5B, in a case where a flange is formed on the entire circumference of the circumferential wall 3 of the heat spreader 1, a flange is also formed on the bottom edge of a pair of the side walls 3D and 3E, as indicated by dotted lines. If the flange's width is set at t without changing the overall size of the heat spreader 1, there is no choice but to form each of the side walls 3D and 3E to an inner side (i.e., the left side corresponding to the side wall 3D, and the right side corresponding to the side wall 3E, as viewed in FIG. 5B) of the heat spreader 1 by the flange's width t, as indicated by the dotted lines in FIG. 5B.

On the other hand, in the heat spreader 1 according to the first embodiment, the ear portions 4 and 5 are formed only on the side walls 3A and 3B, respectively, as illustrated in FIG. 5C. In this case, while a flange on each of the side walls 3D and 3E can be eliminated, a region to be pressed by the pressing projections 23 and 23 of the lid member 14 of the socket 12 can be assured. As a result, each of the side walls 3D and 3E can be formed to an outer side of the heat spreader 1 by the flange's width t, as indicated by sold lines in FIG. 5B.

If it is assumed that the length and the width of the cavity within the heat spreader 1 are 1 and w, respectively, the cavity area of the embodiment heat spreader 1 having no flange on the side walls 3D, 3E is given by l×w. On the other hand, in a conventional heat spreader having a flange on each side wall, the length l is reduced by 2 t, and the cavity area thereof is given by (l−2 t)×w. That is, the cavity area of the embodiment heat spreader 1 is increased, as compared with the cavity area of the conventional heat spreader. Also, if it is assumed that the height of the heat spreader 1 is h, the cavity volume of the embodiment heat spreader 1 is given by l×w×h. On the other hand, the cavity volume of the conventional heat spreader is given by (l−2 t)×w×h. Thus, the cavity volume of the embodiment heat spreader 1 is also increased, as compared with the cavity volume of the conventional heat spreader.

Next, a heat spreader according to the second embodiment and an IC package clamper having the heat spreader according to the second embodiment are described hereinafter with reference to FIGS. 6 to 9C.

In the heat spreader 1 according to the first embodiment, the rectangular ear portions 4 and 5 extend horizontally and outwardly from the bottom edges of the facing side walls 3A and 3B at the lengthwise central portions thereof, respectively. A heat spreader 31 according to the second embodiment differs from the heat spreader 1 according to the first embodiment in that, as illustrated in FIGS. 6 to 9C, circular arcwise ear portions 32 and 33 not only extend outwardly and horizontally from the bottom edges of the side walls 3A and 3B, respectively, but also inwardly retract into the side walls 3A and 3B like circular arcs, respectively.

Basically, an IC package clamper using the heat spreader 31 according to the second embodiment has a configuration similar to that of the clamper for connecting the IC package 6 to a motherboard according to the first embodiment. In the following description, the same component as that of the first embodiment is designated with the same reference numeral used to designate the associated component in the first embodiment, and the description of such a component is omitted. Components differing from those of the first embodiment are mainly described hereinafter.

Figure 6:
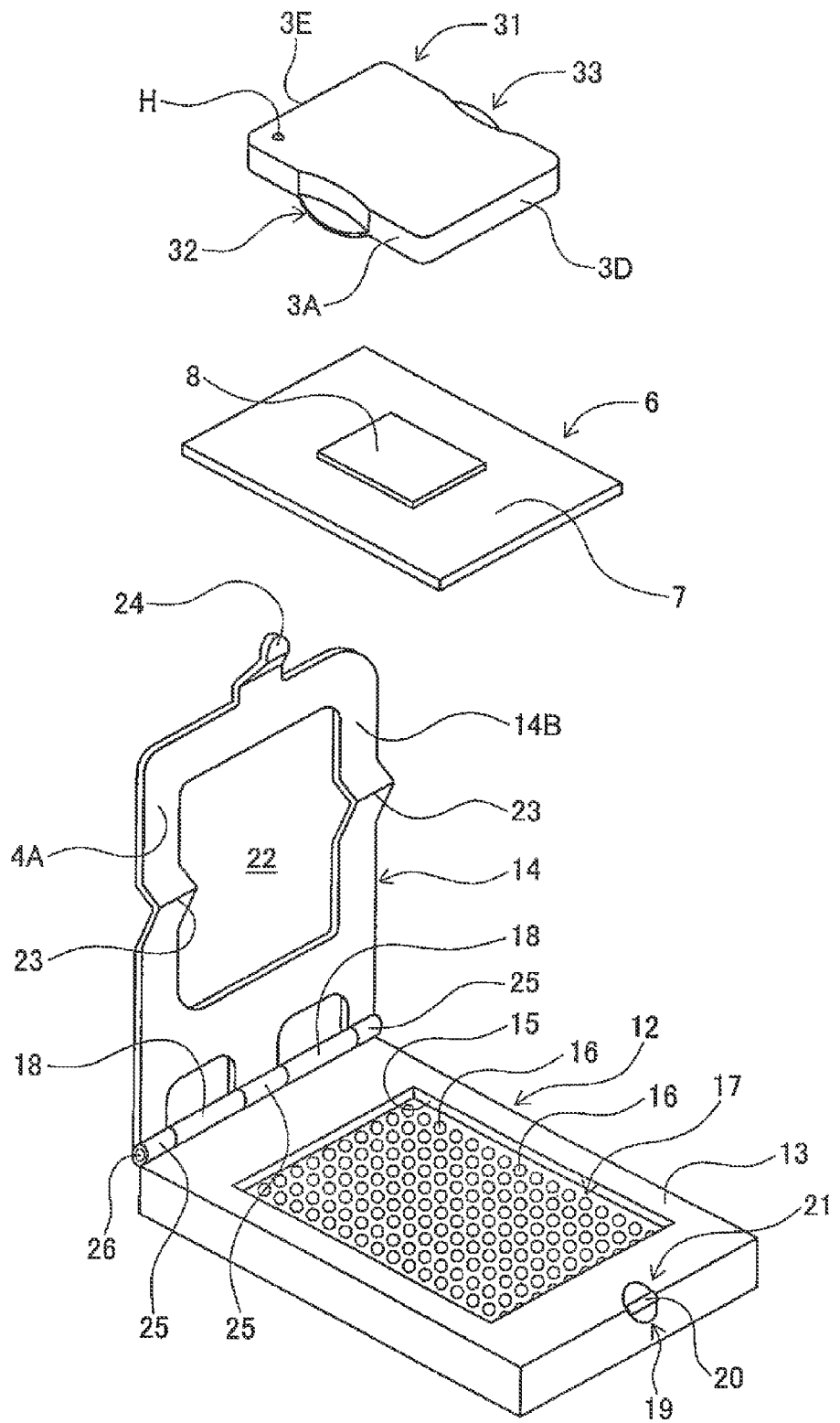
FIG. 6 is an exploded view illustrating a clamper on which a heat spreader according to a second embodiment is mounted.

In the second embodiment, the heat spreader 31 is formed into a rectangular-box-like shape by performing press working or the like onto a metal plate obtained by plating a copper surface with nickel, as illustrated in FIG. 6. The heat spreader 31 has a rectangular-shaped top wall 2, a circumferential wall 3 formed continuously from the entire circumference of the top wall 2. The heat spreader 31 also has ear portions 32 and 33 respectively formed at the lengthwise central portions of the facing side walls 3A and 3B of the circumferential wall 3. The ear portions 32 and 33 extend horizontally and outwardly from the bottom edges of the side walls 3A and 3B.

Each of the ear portions 32 and 33 has a first circular arcwise portion 34 extending outwardly from an outer wall surface of an associated one of the side walls 3A and 3B, and a second circular arcwise portion 35 retracting inwardly into the outer wall surfaces of an associated one of the side walls 3A and 3B.

As illustrated in FIGS. 9B and 9C, the first circular arcwise portion 34 outwardly extends from the outer wall surface of each of the side walls 3A and 3B by a width t, which is the same as the width t of each of the ear portions 4 and 5 of the heat spreader 1 according to the first embodiment. On the other hand, the second circular arcwise portion 35 inwardly retracts from the outer wall surface of each of the side walls 3A and 3B by a width 0.5 t, which is the same as half the width t of each of the ear portions 4 and 5 of the heat spreader 1 according to the first embodiment, as illustrated in FIG. 9C.

Figure 9A:
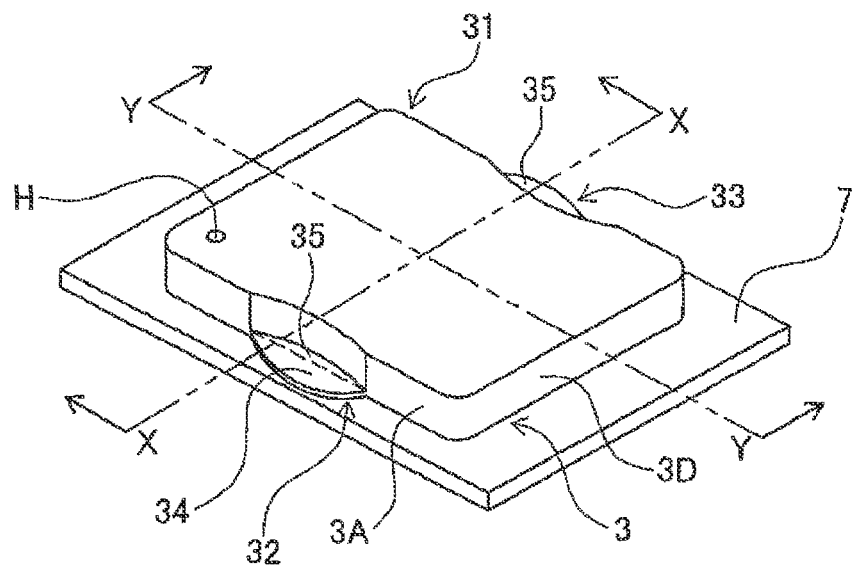
FIG. 9A illustrates an IC package on which the heat spreader is mounted.
Figure 9A:
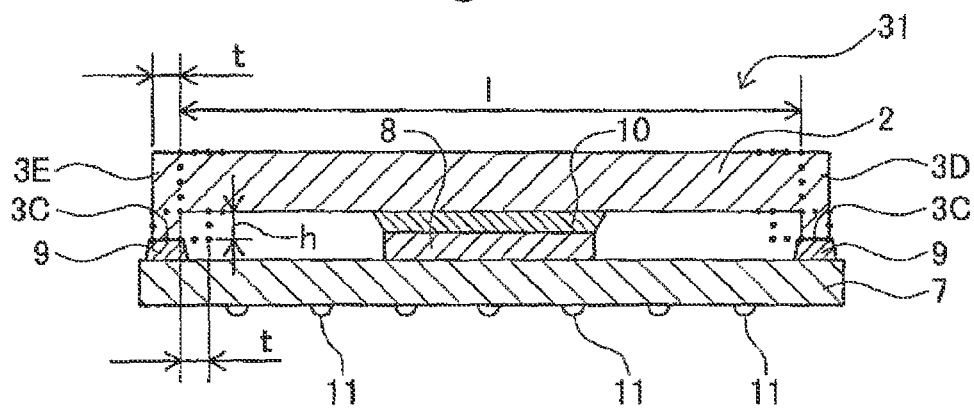
Figure 9A:
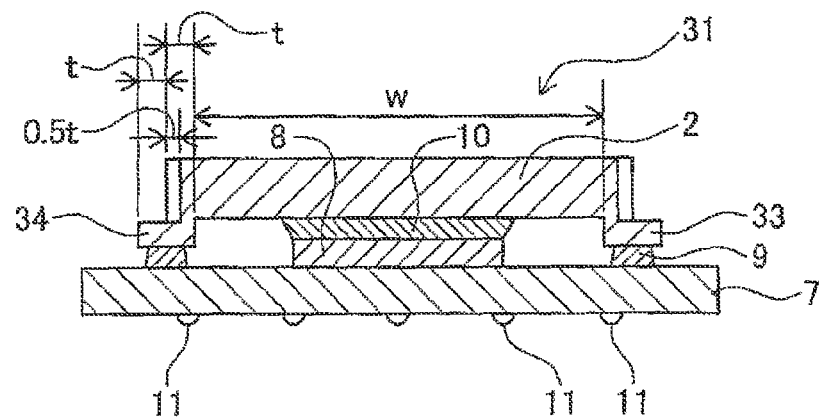
Figure 10A:
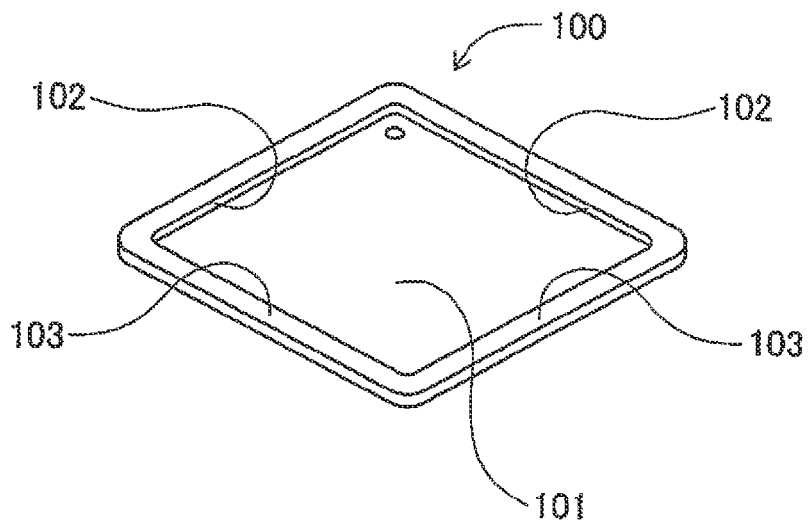
FIG. 10A illustrates the back surface of a conventional heat spreader.
Figure 10B:
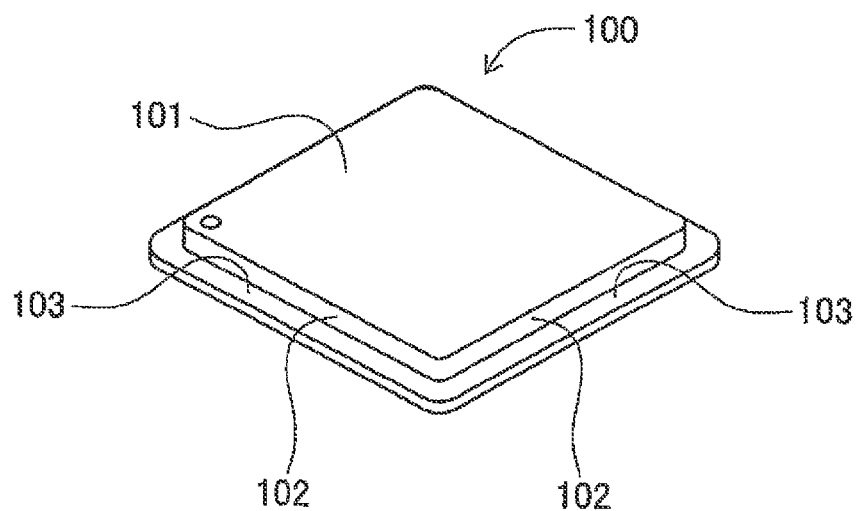
FIG. 10B illustrates the top surface of the conventional heat spreader.

Then, the bottom edge 3C of the heat spreader 31 according to the second embodiment is bonded to the top surface of the circuit board 7 via the adhesive layer 9, as illustrated in FIGS. 9A to 9C, as in the first embodiment. Similarly, the ear portions 32 and 33 on the side walls 3A and 3B of the heat spreader 31 are bonded to the top surface of the circuit board 7 via the adhesive layer 9. In addition, the back surface of the top wall 2 is bonded to the top surface of the IC chip 8 via the adhesive layer 10. Thus, the heat spreader 31 is bonded and fixed to the IC package 6.

Figure 7:
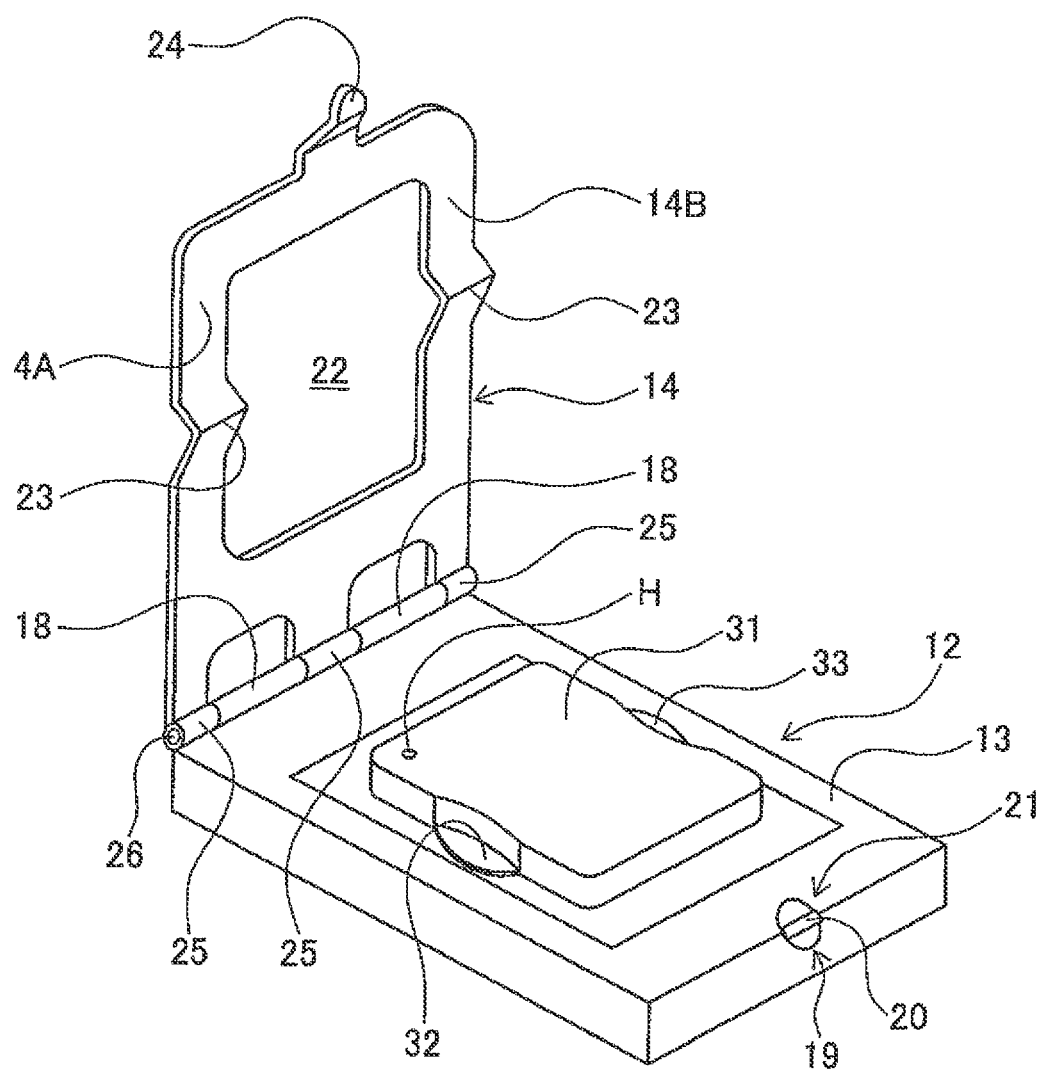
FIG. 7 illustrates a clamper in a state where an IC package on which the heat spreader is mounted is mounted on a socket.

Then, as illustrated in FIG. 7, the IC package 6 to which the heat spreader 31 is bonded and fixed is fit into the opening 15 provided in the top surface of the socket body 13. In this state, the connection terminals 11 on the circuit board 7 are respectively aligned with the connection bumps 16 on the base substrate 17, the top surface of the circuit board 7 is flush with that of the socket body 13, and the ear portions 32 and 33 are upwardly positioned with respect to a common flush surface of the circuit board 7 and the socket body 13.

Figure 8:
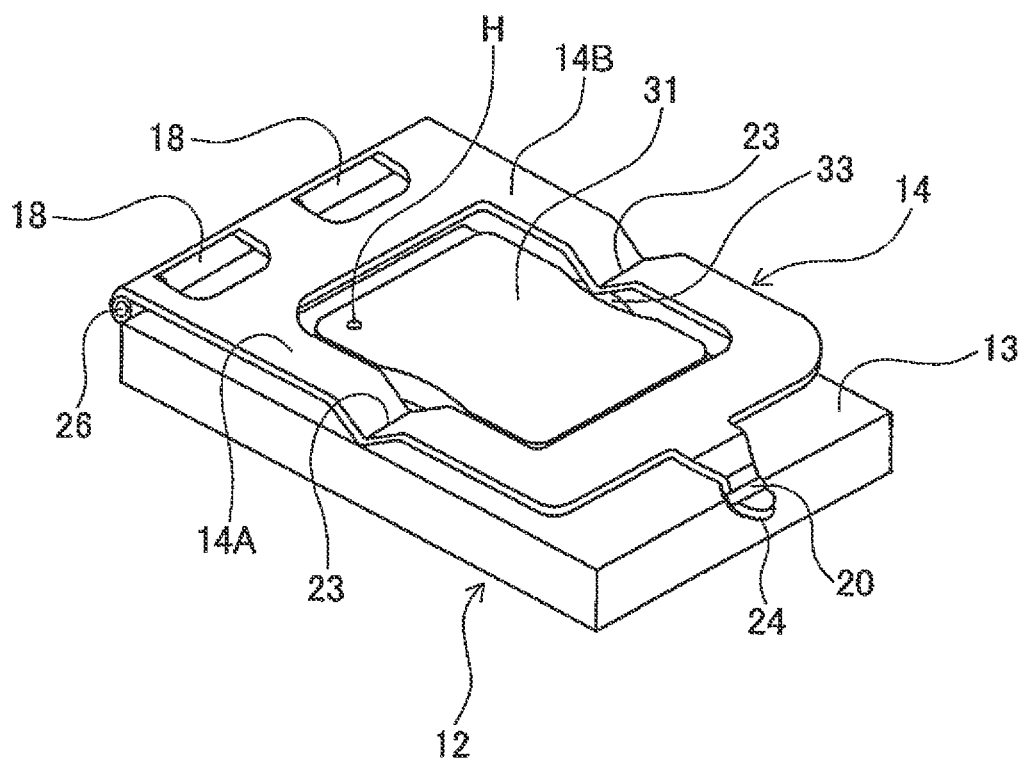
FIG. 8 illustrates a clamper in a state wherein an IC package on which the heat spreader is mounted is mounted on a socket, and wherein a lid member is closed.

Then, the lid member 14 of the socket 12 is turned in a direction (i.e., a direction to a near or right side, as viewed in FIG. 7) in which the socket body 13 is closed, and the engaging piece 24 of the lid member 14 is engaged with the bar-like portion 19 of the engaging portion 21 of the socket body 13, as illustrated in FIG. 8.

As illustrated in FIG. 8, in a state where the socket body 13 is closed by the lid member 14, the V-shaped pressing projections 23 and 23 on the pressing portions 14A and 14B elastically press the ear portions 32 and 33 of the heat spreader 31. Consequently, the connection terminals 11 on the circuit board 7 are respectively electrically connected to the connection bumps 16 on the top surface of the base substrate 17 which is provided on the socket body 13 of the socket 12.

According to the second embodiment, in the heat spreader 31, and the clamper for connecting the IC package 6 to the motherboard (not illustrated), which uses the heat spreader 31, the ear portions 32 and 33 are formed to each extend horizontally and outwardly from the bottom edge 3C of an associated one of a facing pair of side walls 3A and 3B at the lengthwise central portion thereof, without forming a flange along the entire circumference of the circumferential wall 3 of the heat spreader 31. Each of the ear portions 32 and 33 is elastically pressed by a pair of the pressing projections 23 and 23 formed on the lid member 14 of the socket 12. Thus, positions of the other facing pair of the side walls 3D and 3E of the circumferential wall 3 having no ear portions can be shifted outwardly by the width t of each ear portion as compared with a case where an ear portion or flange would be formed thereon. Accordingly, the second embodiment can realize the heat spreader 31 suitable for the implementation of the multichip structure of an IC package by increasing a cavity area/volume without changing the overall size thereof. In addition, the second embodiment can realize the clamper for connecting the IC package 6 to a motherboard, which has the heat spreader 31.

Each of the ear portions 32 and 33 of the heat spreader 31 according to the second embodiment has the first circular arcwise portion 34 outwardly extending by a width t from the outer wall surface of the associated one of the side walls 3A and 3B, and the second circular arcwise portion 35 inwardly retracting by a width 0.5 t into the outer wall surfaces of the associated one of the side walls 3A and 3B. Thus, when the socket body 13 is closed by the lid member 14 of the socket 12, a region to be pressed by the pressing projections 23 and 23 of the lid member 14 can be enlarged. For example, by increasing the width of each of the pressing projections 23 and 23 for pressing the ear portions 32 and 33, the magnitude of a pressing force for pressing the circuit board 7 of the IC package 6 against the base substrate 17 of the socket 12 can be increased, thereby enhancing the reliability of the pressure-connection between the connection terminals 11 of the circuit board 7 and the connection bumps 16 of the base substrate 17.

Hereinafter, why the cavity area/volume can be increased according to the heat spreader 31 according to the second embodiment will be described with reference to FIGS. 9A to 9C.

As illustrated in FIG. 9B, in a case where a flange is formed on the entire circumference of the circumferential wall 3 of the heat spreader 31, a flange is also formed on the bottom edge of a pair of the side walls 3D and 3E, as indicated by dotted lines. If the flange's width is set at t without changing the overall size of the heat spreader 31, there is no choice but to form each of the side walls 3D and 3E to an inner side (i.e., the left side corresponding to the side wall 3D, and the right side corresponding to the side wall 3E, as viewed in FIG. 9B) of the heat spreader 31 by the flange's width t, as indicated by the dotted lines in FIG. 9B.

On the other hand, in the heat spreader 31 according to the second embodiment, the ear portions 32 and 33 are formed only on the side walls 3A and 3B, respectively, as illustrated in FIG. 9C. In this case, while a flange on each of the side walls 3D and 3E can be eliminated, a region to be pressed by the pressing projections 23 and 23 of the lid member 14 of the socket 12 can be assured. As a result, each of the side walls 3D and 3E can be formed to an outer side of the heat spreader 1 by the flange's width t, as indicated by sold lines in FIG. 9B.

If it is assumed that the length and the width of the cavity within the heat spreader 1 are l and w, respectively, the cavity area of the embodiment heat spreader 1 is given by l×w. On the other hand, in a conventional heat spreader having a flange on each side wall, the length l is reduced by 2 t, and the cavity area thereof is given by (l−2 t)×w. That is, the cavity area of the embodiment heat spreader 31 is increased, as compared with the cavity area of the conventional heat spreader. Also, if it is assumed that the height of the heat spreader 31 is h, the cavity volume of the embodiment heat spreader 31 is given by l×w×h. On the other hand, the cavity volume of the conventional heat spreader is given by (l−2 t)×w×h. Thus, the cavity volume of the embodiment heat spreader 31 is also increased, as compared with the cavity volume of the conventional heat spreader.

According to the second embodiment, the ear portions 32 and 33 of the heat spreader 31 includes the second circular arcwise portions 35 inwardly retracting into the outer wall surfaces of the side walls 3A and 3B. Each of the second circular arcwise portions 35 inwardly retracts with respect to the outer wall surface of an associated one of the side walls 3A and 3B by 0.5 t which is about half of the thickness of the heat spreader 31. On the other hand, an inner width of the heat spreader 31 is w that is the same as that of the heat spreader 1 according to the first embodiment. Thus, the cavity area and the cavity volume of the heat spreader 31 are the same as those of the heat spreader 1 according to the first embodiment.

The invention is not limited to the above-described embodiments. Apparently, various improvements and modifications can be made without departing from the scope of the invention.

The invention claimed is:

1. A heat spreader to be mounted on an IC package,
the IC package comprising:
   a circuit board;
   an IC chip mounted on one surface of the circuit board; and
   a plurality of connection terminals formed on the other surface of the circuit board,
the heat spreader comprising:
   a top wall formed into a rectangular shape;
   a circumferential wall formed continuously from the top wall, the circumferential wall and the top wall defining a block-like cavity for enclosing the IC chip when the heat spreader is mounted on the IC package; and
   ear portions formed at lengthwise central portions of a facing pair of side walls of the circumferential wall so to extend outwardly from bottom edges of the facing pair of side walls, respectively,
   each of the ear portions comprising:
      a first arcwise portion outwardly extending from the bottom edge of the corresponding sidewall; and
      a second arcwise portion inwardly retracted from the bottom edge of the corresponding side wall.

2. An IC package clamper comprising:
an IC package comprising:
   a circuit board;
   an IC chip mounted on one surface of the circuit board; and
   a plurality of connection terminals formed on the other surface of the circuit board;
a heat spreader mounted on the IC package comprising:
   a top wall formed into a rectangular shape, a bottom surface of the top wall contacting a top surface of the IC chip;
   a circumferential wall formed continuously from the top wall, a bottom edge of the circumferential wall contacting a top surface of the circuit board, the circumferential wall and the top wall defining a block-like cavity in which the IC chip is enclosed; and
   ear portions formed at lengthwise central portions of a facing pair of side walls of the circumferential wall so to extend outwardly from the bottom edges of the facing pair of side walls, respectively; and
a socket clamping the IC package together with the heat spreader, the socket comprising:
   a socket body configured to receive the circuit board;
   a plurality of connection bumps formed in the socked body, the connection bumps being electrically connected to the connection terminals, respectively;
   a lid member turnably attached to one side of the socket body so as to be openable/closable with respect to the socket body, the lid member and the socket body clamping the IC package and the heat spreader therebetween; and
   a pair of pressing portions formed on the lid member and configured to elastically press the ear portions, respectively, in a state where the IC package and the heat spreader are clamped between the lid member and the socket body.

3. The IC package clamper of claim 2,
wherein the lid member is formed of an elastic thin plate, and
wherein each pressing portion is configured by a V-shaped protrusion.

4. The IC package clamper of claim 2,
wherein an engaging portion is formed on the other side of the socket body,
wherein an engaging piece is formed on the lid member at a side opposite to a side attached to the one side of the socket body, and
wherein the pressing portions elastically press the ear portions, respectively, in a state where the IC package and the heat spreader are clamped between the lid member and the socket body and where the engaging piece is engaged with the engaging portion.

5. The IC package clamper of claim 2,
wherein the ear portions are formed only at one facing pair of side walls of the circumferential wall.

6. The IC package clamper of claim 5,
wherein each ear portions is formed not entirely along an associated wall of the one facing pair of side walls.

7. The IC package clamper of claim 1,
wherein the ear portions are formed only at one facing pair of side walls of the circumferential wall.

8. The IC package clamper of claim 7,
wherein each ear portions is formed not entirely along an associated wall of the one facing pair of side walls.

* * * * *